(12) United States Patent
Fan et al.

(10) Patent No.: US 11,456,342 B2
(45) Date of Patent: Sep. 27, 2022

(54) ORGANIC LIGHT EMITTING DIODE BACK PLATE AND METHOD OF MANUFACTURING SAME

(71) Applicant: SHENZHEN CHINA STAR OPTOELECTRONICS SEMICONDUCTOR DISPLAY TECHNOLOGY CO., LTD., Shenzhen (CN)

(72) Inventors: Yingchun Fan, Shenzhen (CN); Kunpeng He, Shenzhen (CN)

(*) Notice: Subject to any disclaimer, the term of this patent is extended or adjusted under 35 U.S.C. 154(b) by 287 days.

(21) Appl. No.: 16/620,506

(22) PCT Filed: Nov. 22, 2019

(86) PCT No.: PCT/CN2019/120317
§ 371 (c)(1),
(2) Date: Dec. 8, 2019

(87) PCT Pub. No.: WO2021/088144
PCT Pub. Date: May 14, 2021

(65) Prior Publication Data
US 2021/0359044 A1    Nov. 18, 2021

(30) Foreign Application Priority Data
Nov. 8, 2019 (CN) .......................... 201911089809.5

(51) Int. Cl.
*H01L 27/32* (2006.01)
*H01L 51/56* (2006.01)
(Continued)

(52) U.S. Cl.
CPC ...... *H01L 27/3246* (2013.01); *H01L 51/5259* (2013.01); *H01L 51/56* (2013.01);
(Continued)

(58) Field of Classification Search
CPC .................................................. H01L 27/3246
See application file for complete search history.

(56) References Cited

U.S. PATENT DOCUMENTS

| | | | |
|---|---|---|---|
| 6,388,377 B1 * | 5/2002 | Kobayashi | H05B 33/10 313/505 |
| 7,307,382 B2 * | 12/2007 | Uhlig | H01L 27/3283 313/506 |

(Continued)

FOREIGN PATENT DOCUMENTS

| CN | 102226889 A | * 10/2011 | H01L 27/32 |
|---|---|---|---|
| CN | 102226998 A | 10/2011 | |

(Continued)

OTHER PUBLICATIONS

Machine translation, Pengyu, Chinese Pat. Pub. No. CN102226889A, translation date: Nov. 17, 2021, Espacenet, all pages. (Year: 2021).*

(Continued)

*Primary Examiner* — Victoria K. Hall

(57) ABSTRACT

A method of manufacturing an OLED back plate and an OLED back plate are provided. The method includes: providing a TFT substrate and forming an electrode layer on the TFT substrate; forming a pixel defining layer on the electrode layer by using a first mask, and forming a plurality of pixel units, each of the pixel units includes a light emitting area, and an inter-pixel area is formed between adjacent two of the pixel units; etching the electrode layer corresponding to the inter-pixel area; removing the pixel defining layer corresponding to the light emitting area to form a pixel opening; and forming a barrier block on adjacent two of the pixel defining layers of adjacent two of the pixel units by a second mask, and the barrier block does not completely cover the pixel defining layer.

13 Claims, 8 Drawing Sheets

(51) Int. Cl.
 *H01L 51/52* (2006.01)
 *H01L 51/00* (2006.01)
(52) U.S. Cl.
 CPC ....... *H01L 51/0005* (2013.01); *H01L 51/0011* (2013.01); *H01L 51/0023* (2013.01); *H01L 2227/323* (2013.01)

(56) References Cited

U.S. PATENT DOCUMENTS

| | | | | |
|---|---|---|---|---|
| 7,888,867 | B2* | 2/2011 | Yoshida | H01L 27/3246 313/506 |
| 8,778,712 | B2* | 7/2014 | Takeuchi | H01L 51/56 438/33 |
| 8,816,339 | B2* | 8/2014 | Kawamura | H01L 27/3258 257/40 |
| 8,836,214 | B2* | 9/2014 | Gregory | H01L 27/3283 313/504 |
| 8,921,838 | B2* | 12/2014 | Takeuchi | H01L 51/5088 257/40 |
| 9,035,330 | B2* | 5/2015 | Kang | H01L 27/3246 257/88 |
| 9,419,223 | B2* | 8/2016 | Kang | H01L 51/0005 |
| 9,698,347 | B2* | 7/2017 | Matsushima | H01L 27/3246 |
| 9,748,317 | B2* | 8/2017 | Kim | H01L 27/3246 |
| 9,917,277 | B2* | 3/2018 | Koresawa | G02B 5/201 |
| 9,947,731 | B2* | 4/2018 | Jiao | H01L 27/3246 |
| 10,079,272 | B2* | 9/2018 | Song | H01L 27/3276 |
| 10,342,124 | B2* | 7/2019 | Jikumaru | G02F 1/13394 |
| 10,388,222 | B2* | 8/2019 | Joo | H05B 33/10 |
| 10,847,591 | B1* | 11/2020 | Kim | H01L 27/3246 |
| 2004/0056588 | A1* | 3/2004 | Nozawa | H01L 27/3244 313/504 |
| 2004/0140759 | A1* | 7/2004 | Park | H01L 27/3283 313/504 |
| 2004/0201048 | A1* | 10/2004 | Seki | H01L 51/0005 257/294 |
| 2005/0093441 | A1* | 5/2005 | Uhlig | H01L 51/0005 313/506 |
| 2005/0133802 | A1* | 6/2005 | Lee | H01L 27/3246 257/95 |
| 2005/0237780 | A1* | 10/2005 | Sakai | H01L 51/5221 365/111 |
| 2006/0055999 | A1* | 3/2006 | Bae | H01L 27/3251 359/245 |
| 2007/0157839 | A1* | 7/2007 | Kim | H01J 9/2278 101/483 |
| 2007/0165057 | A1* | 7/2007 | Chou | H01L 27/3283 347/15 |
| 2009/0256474 | A1* | 10/2009 | Wang | H01L 51/0003 313/504 |
| 2010/0213827 | A1* | 8/2010 | Yoshida | H01L 27/3246 313/504 |
| 2012/0040478 | A1* | 2/2012 | Takeuchi | H01L 27/3246 438/23 |
| 2012/0181525 | A1* | 7/2012 | Sugimoto | H01L 27/3258 257/40 |
| 2013/0099221 | A1* | 4/2013 | Kawamura | H01L 51/52 257/40 |
| 2013/0134449 | A1* | 5/2013 | Chen | H01L 27/329 257/88 |
| 2013/0277649 | A1* | 10/2013 | Gregory | H01L 51/5253 257/40 |
| 2014/0206119 | A1* | 7/2014 | Kang | H01L 51/0012 438/34 |
| 2015/0001485 | A1* | 1/2015 | Kang | H01L 51/0005 257/40 |
| 2015/0171327 | A1* | 6/2015 | Matsushima | H01L 27/3246 257/40 |
| 2016/0079322 | A1* | 3/2016 | Kim | H01L 27/3246 257/40 |
| 2016/0365396 | A1* | 12/2016 | Jiao | H01L 27/3246 |
| 2017/0154934 | A1 | 6/2017 | Kim et al. | |
| 2017/0213878 | A1* | 7/2017 | Song | H01L 27/3258 |
| 2019/0123116 | A1* | 4/2019 | Wang | H01L 51/5221 |
| 2019/0189713 | A1* | 6/2019 | Kondo | H01L 51/5056 |
| 2020/0013839 | A1* | 1/2020 | Tanaka | H01L 27/3276 |
| 2021/0118964 | A1* | 4/2021 | Gong | H01L 51/0005 |
| 2021/0288121 | A1* | 9/2021 | Yan | H01L 51/0005 |

FOREIGN PATENT DOCUMENTS

| | | | | |
|---|---|---|---|---|
| CN | 105845711 A | * | 8/2016 | ............ H01L 27/32 |
| CN | 105845711 A | | 8/2016 | |
| CN | 107393939 A | | 11/2017 | |
| CN | 107565063 A | | 1/2018 | |
| CN | 107819017 A | * | 3/2018 | ............ H01L 27/32 |
| CN | 107819017 A | * | 3/2018 | ......... H01L 27/3246 |
| CN | 107819017 A | | 3/2018 | |
| CN | 107819080 A | | 3/2018 | |
| CN | 108538892 A | | 9/2018 | |
| CN | 108832009 A | | 11/2018 | |
| CN | 110137225 A | | 8/2019 | |
| WO | 2019173946 A1 | | 9/2019 | |
| WO | WO-2019173946 A1 | * | 9/2019 | ............ H01L 27/32 |

OTHER PUBLICATIONS

Machine translation, Wang, Chinese Pat. Pub. No. CN105845711A, translation date: Nov. 17, 2021, Espacenet, all pages. (Year: 2021).*
Machine translation, Wang, Chinese Pat. Pub. No. CN107819017A, translation date: Nov. 17, 2021, Espacenet, all pages. (Year: 2021).*
International Search Report, International application No. PCT/CN2019/120317, International Search Authority (China National Intellectual Property Administration), dated Aug. 12, 2020, all pages. (Year: 2020).*
Written Opinion of the International Search Authority, International application No. PCT/CN2019/120317, International Search Authority (China National Intellectual Property Administration), dated Aug. 12, 2020, all pages. (Year: 2020).*
Machine translation, Written Opinion of the International Search Authority, International application No. PCT/CN2019/120317, International Search Authority (China National Intellectual Property Administration), translation date: Nov. 16, 2021, all pages. (Year: 2021).*
Machine translation, Wang, Chinese Pat. Pub. No. CN107819017A, translation date: Feb. 27, 2022, Espacenet, all pages. (Year: 2022).*

* cited by examiner

ORGANIC LIGHT EMITTING DIODE BACK PLATE AND METHOD OF MANUFACTURING SAME

FIELD OF INVENTION

This disclosure relates to the field of display technology, and more particularly, to a method of manufacturing an organic light emitting diode (OLED) back plate and the OLED back plate.

BACKGROUND OF INVENTION

Organic light emitting diode (OLED) displays have the advantages of self-illumination, low driving voltage, high luminous efficiency, short response times, high resolution and contrast ratios, wide viewing angles, wide temperature ranges, flexible display, large area full color display, and others. The OLED displays are recognized by the industry as the most promising display devices.

In consideration of the enlargement of the OLED display and the cost reduction of OLED materials, inkjet printing (IJP) technology, which is suitable for the development of large-sized OLED displays, has been developed in addition to the conventional vapor deposition in the OLED manufacturing processes. In order to ensure the quality of an OLED display panel manufactured by the inkjet printing, the ink is dropped into a predetermined light emitting region and is needed to be spread evenly. Moreover, inks in different colors should not be mixed.

A pixel defining layer in a conventional OLED back plate is formed by forming a patterned anode layer on a TFT substrate 1, and forming barriers 2 around each of pixel units 3 using a hydrophobic material, as shown in FIG. 1. However, the conventional barriers 2 do not make ink droplets spread evenly over the predetermined light emitting regions, as shown in FIG. 2A. When the printed inks are solidified, excessive contact angles of the ink droplets I close to lateral sides of the barriers 2 occur, so that a thickness T1 of a portion of the ink droplets I close to lateral sides of the barriers is much larger than a thickness T2 of a portion of the ink droplets I away from the lateral sides of the barriers 2 (i.e., corresponding to the middle of the light emitting region), as shown in FIG. 2B. Thus, the uniformity of the ink droplets I in the pixel units 3 is poor, affecting the subsequent processes and the display effects. In addition, the ink droplets between adjacent two pixel units may also cause the problem of color mixture.

SUMMARY OF INVENTION

An object of the disclosure is to provide a method of manufacturing an organic light emitting diode (OLED) back plate and the OLED back plate to solve the technical problems that the conventional barriers 2 do not make ink droplets spread evenly over the predetermined light emitting regions. When the printed inks are solidified, excessive contact angles of the ink droplets I close to lateral sides of the barriers 2 occur, so that a thickness of a portion of the ink droplets close to lateral sides of the barriers is much larger than a thickness of a portion of the ink droplets away from the lateral sides of the barriers 2 (i.e., corresponding to the middle of the light emitting region). Thus, the uniformity of the ink droplets in the pixel units 3 is poor, affecting the subsequent processes and the display effects. In addition, the ink droplets between adjacent two pixel units may also cause the problem of color mixture.

In order to solve the above problems, the disclosure provides a method of manufacturing an OLED back plate. The method comprises steps of:

providing a TFT substrate, and forming an electrode layer on the TFT substrate;

forming a pixel defining layer on the electrode layer by using a first mask, and forming a plurality of pixel units, wherein each of the pixel units comprises a light emitting area, and an inter-pixel area is formed between adjacent two of the pixel units;

etching the electrode layer corresponding to the inter-pixel area;

removing the pixel defining layer corresponding to the light emitting area to form a pixel opening; and forming a barrier block on adjacent two of the pixel defining layers of adjacent two of the pixel units by a second mask.

In an embodiment of the disclosure, a recess is formed on a top surface of the barrier block.

In an embodiment of the disclosure, the barrier block is made of a hydrophobic material.

In an embodiment of the disclosure, the first mask is a halftone mask or a grayscale mask.

In an embodiment of the disclosure, the pixel defining layer is made of a photosensitive material.

In an embodiment of the disclosure, the barrier block extends from the pixel defining layer to adjacent two of the electrode layers between the adjacent two of the pixel units.

In an embodiment of the disclosure, the first mask comprises a light transmission area and a half light transmission area, the light transmission region corresponds to the inter-pixel area, and the half light transmission region corresponds to the light emitting area.

In an embodiment of the disclosure, a projection area of the inter-pixel area is smaller than a projection area of an area between the electrode layers of adjacent two of the pixel units.

In an embodiment of the disclosure, the pixel defining layer is disposed around the pixel opening, and the barrier block is disposed around the pixel opening.

The disclosure further provides an OLED back plate. The OLED back plate comprises:

a TFT substrate; and a plurality of pixel units disposed on the TFT substrate. An inter-pixel area is disposed between adjacent two of the pixel units.

Each of the pixel units comprises an electrode layer, a pixel defining layer disposed on the electrode layer and a barrier block. A pixel opening is disposed on the pixel defining layer above the electrode layer, and the barrier block is disposed on adjacent two of the pixel defining layers of adjacent two of the pixel units.

In an embodiment of the disclosure, a recess is disposed on a top surface of the barrier block.

In an embodiment of the disclosure, the barrier block is made of a hydrophobic material.

In an embodiment of the disclosure, the pixel defining layer is made of a photosensitive material.

In an embodiment of the disclosure, the barrier block extends from the pixel defining layer to adjacent two of the electrode layers between the adjacent two of the pixel units.

In an embodiment of the disclosure, a projection area of the inter-pixel area is smaller than a projection area of an area between the electrode layers of adjacent two of the pixel units.

In an embodiment of the disclosure, the pixel defining layer is disposed around the pixel opening, and the barrier block is disposed around the pixel opening.

The technical effects are as follows. The disclosure provides a method of manufacturing an OLED back plate and the OLED back plate. The pixel defining layer is formed on the anode layer by the first mask, the barrier block is formed on the pixel defining layer by the second mask, and the barrier block does not completely cover the pixel defining layer. Under the premise that the number and use times of the mask are not increased, a portion of the pixel unit corresponding to an ink droplet having a large thickness close to a side of the barrier block is covered by the pixel defining layer, so that light cannot be emitted from the portion, and a portion of the pixel unit corresponding to an ink droplet having a small thickness away from a side of the barrier block is not covered by the pixel defining layer, so that light is emitted from the portion. The thickness of the ink droplets away from the lateral side of the barrier block (i.e., the pixel opening, the light emitting area of the pixel unit) is uniform, and the uniformity of the ink droplets in the light emitting area of the pixel unit is improved. In addition, the recess of the barrier block can accommodate excess ink droplets. The excess ink droplets flow into the recess without flowing into the adjacent pixel units. Therefore, the amount of ink droplets in each pixel unit can be controlled, and the ink droplets between the two pixel units can be prevented from being mixed, so that the subsequent products can achieve an ideal display effect.

DETAILED DESCRIPTION OF PREFERRED EMBODIMENTS

In order to more clearly describe the embodiments of the disclosure, the description is used to make a simple introduction of the drawings used in the following embodiments.

Referring to FIG. 3A to FIG. 3E, FIG. 4, and FIG. 5, the disclosure provides a method of manufacturing an OLED back plate. The method comprises the following steps.

Figure 1:
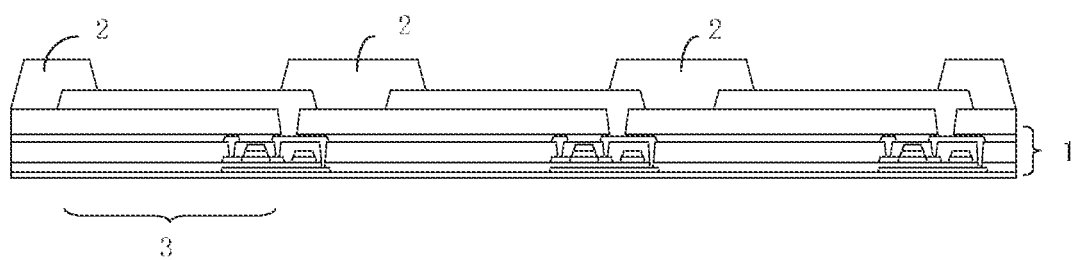
FIG. 1 is a schematic structural diagram of an OLED back plate in the conventional technology.
Figure 2A:
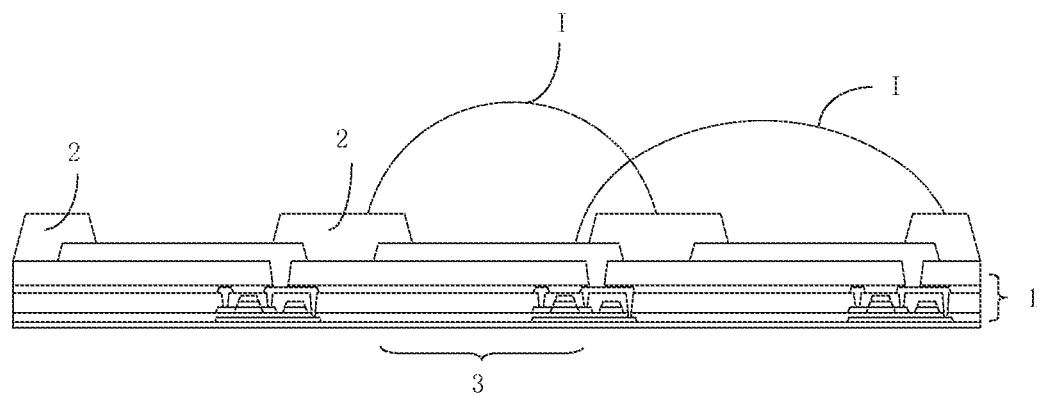
FIG. 2A is a schematic diagram of the OLED back plate after printing ink in the conventional technology.
Figure 2B:
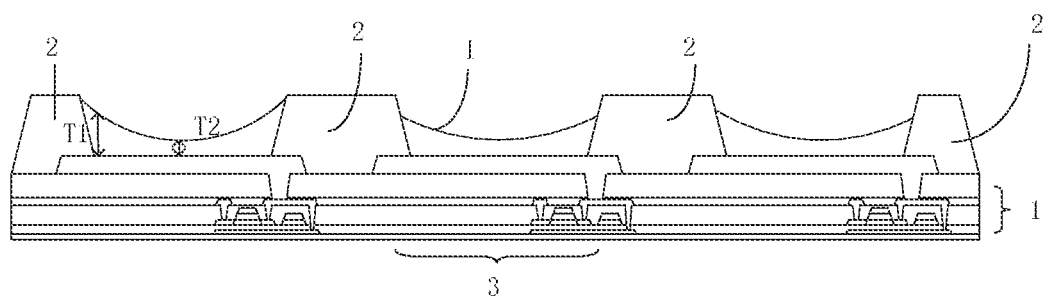
FIG. 2B is a schematic diagram of the OLED back plate after curing the printed ink in the conventional technology.
Figure 3A:
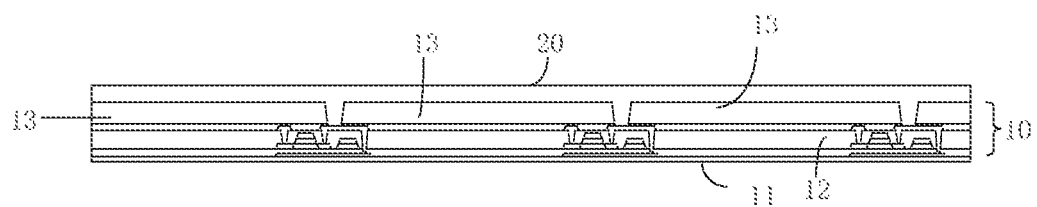
FIG. 3A to FIG. 3E are schematic diagrams of processes of a method of manufacturing an OLED back plate according to the disclosure.

In a step S01, a TFT substrate 10 is provided, and an electrode layer 20 is formed on the TFT substrate 10, as shown in FIG. 3A.

Figure 3B:
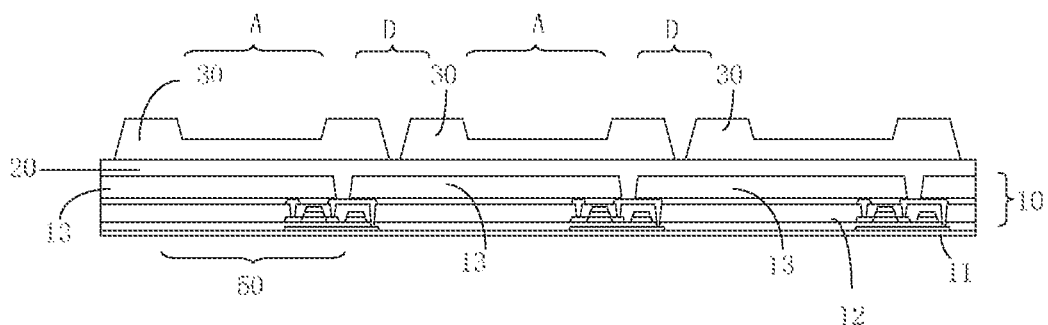

In a step S02, a pixel defining layer 30 is formed on the electrode layer 20 by using a first mask (not shown), thereby forming a plurality of pixel units 50. Each of the pixel units 50 comprises a light emitting area A, and an inter-pixel area D is formed between adjacent two of the pixel units 50, as shown in FIG. 3B.

Figure 3C:
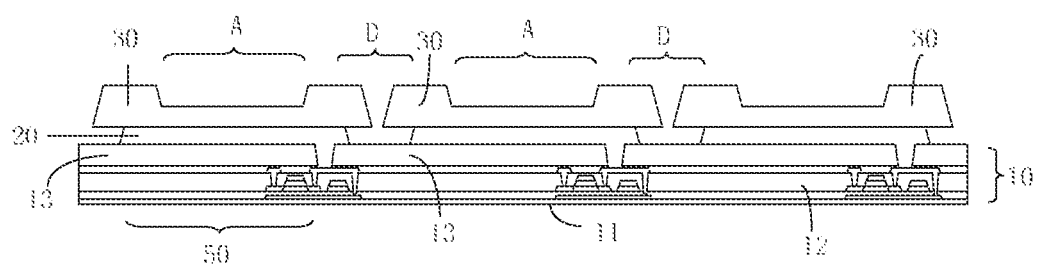

In a step S03, the electrode layer 20 corresponding to the inter-pixel area D is etched, as shown in FIG. 3C.

Figure 3D:
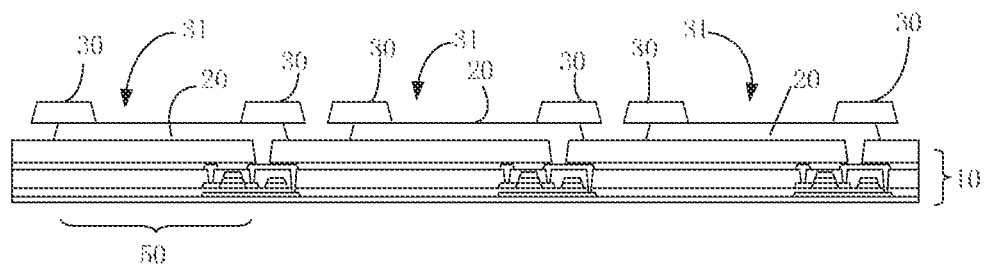

In a step S04, the pixel defining layer 30 corresponding to the light emitting area A is removed to form a pixel opening 31, as shown in FIG. 3D.

Figure 3E:
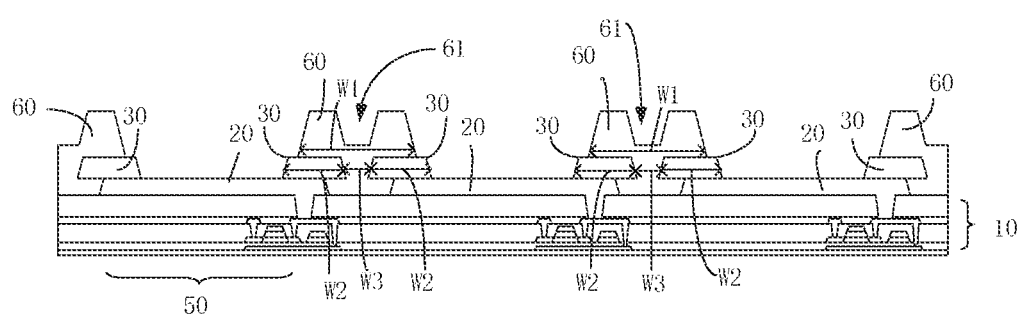
Figure 4:
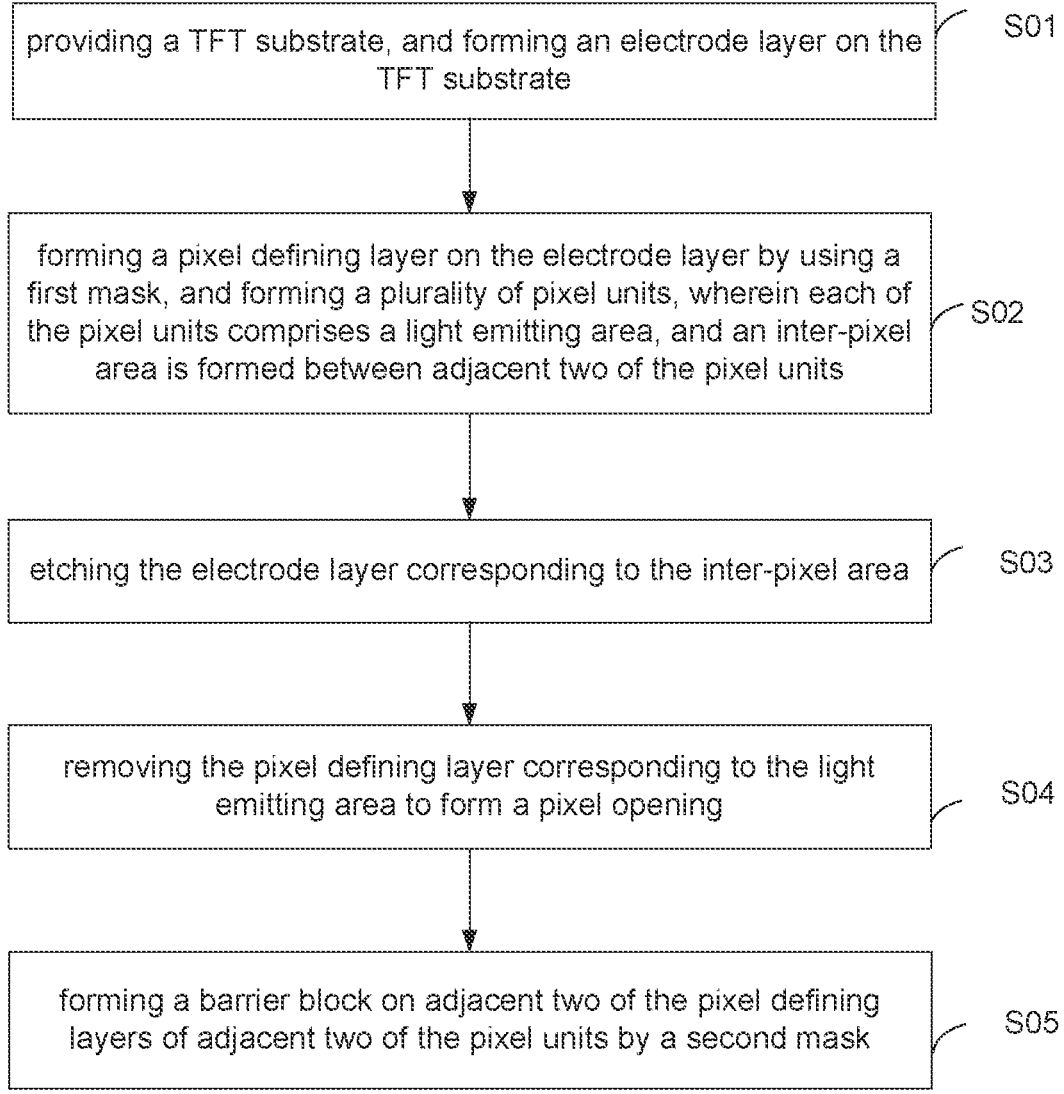
FIG. 4 is a schematic diagram of steps of the method for preparing the OLED backplane according to the disclosure.

In a step S05, a barrier block 60 is formed on adjacent two of the pixel defining layers 30 of adjacent two of the pixel units 50 by a second mask (not shown), as shown in FIG. 3E.

Specifically, a TFT array layer 12 and an electrode layer film are formed on a substrate 11 to form the TFT substrate 10. In some embodiments, a planar layer 13 may be formed between the TFT array layer 12 and the anode layer 20. The pixel defining layer 30 is fabricated by using a first mask, which is a halftone mask or a grayscale mask. The first mask comprises a light transmission area and a half light transmission area, the light transmission region corresponds to the inter-pixel area D, and the half light transmission region corresponds to the light emitting area A.

The substrate 10 may be a flexible substrate, such as a polyimide film. The substrate 10 may also be a rigid substrate, such as a quartz substrate or a glass substrate.

Specifically, a material of the electrode layer 20 is a multi-layer structure composed of indium tin oxide or indium tin oxide-silver-indium tin oxide (ITO/Ag/ITO).

The electrode layer 20 is then etched, and the pixel defining layer 30 corresponding to the light emitting area A is removed by a plasma etching process. The pixel defining layer 30 is disposed around the periphery of the pixel unit 50. For the pixel defining layer 30, the light emitting area A is exposed to form the pixel opening 31, such that the pixel defining layer 30 is disposed around the pixel opening 31, and the barrier block 60 is disposed around the pixel opening 31.

Then, the barrier block 60 is formed across the adjacent two of the pixel defining layers 30 of the adjacent two of the pixel units 50 by using the second mask. In more detail, the barrier block 60 is disposed on both of the adjacent two of the pixel defining layers 30 of the adjacent two of the pixel units 50, and may be a trapezoidal structure, but is not limited thereto. A width W1 of the barrier block 60 is less than a sum of the two respective widths W2 of the adjacent two of the pixel defining layers 30 of the adjacent two of the pixel units 50 and a width W3 of the inter-pixel area D. That is, the barrier block 60 only partially covers the adjacent two of the pixel defining layers 30 of the adjacent two of the pixel units 50, respectively. Moreover, the barrier block 60 extends from the pixel defining layer 30 to a place between the adjacent two of the electrode layers 20 between the adjacent two of the pixel units 50 to prevent the overflowed ink from flowing to the place between the adjacent two of the electrode layers 20. Besides, the barrier block 60 is made of a hydrophobic material, and the pixel defining layer 30 is made of a photosensitive material.

In addition, a top surface of the barrier block 60 comprises a recess 61. According to an embodiment of the present disclosure, a projection area of the inter-pixel area D is smaller than a projection area of an area between the electrode layers 20 of adjacent two of the pixel units 50. That is, the electrode layer is over-etched to facilitate the fabrication of the recess 61. The recess 61 can accommodate excess ink droplets, and the excess ink droplets can flow into the recess 61, rather than flowing into the adjacent pixel unit(s) 50.

Finally, the subsequent evaporation and packaging process is performed to complete the manufacturing of the OLED back plate.

Figure 5:
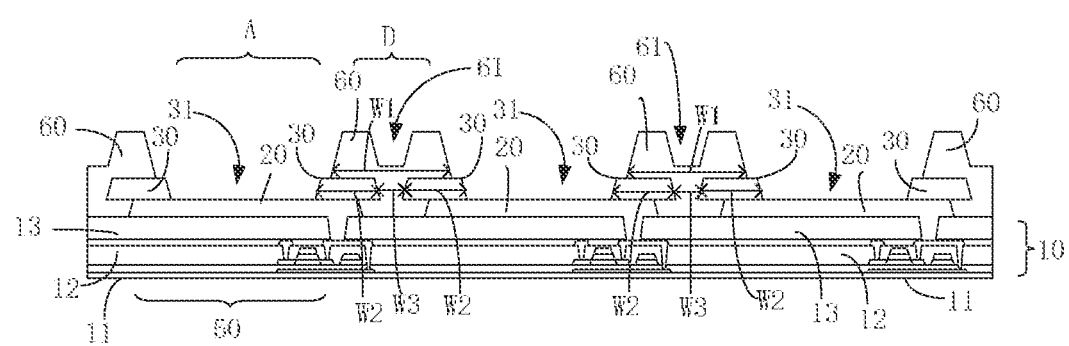
FIG. 5 is a schematic structural diagram of an OLED back plate according to the disclosure.

Referring to FIG. 5, the disclosure further provides an OLED back plate. The OLED back plate comprises a TFT substrate 10, a plurality of pixel units 50, and a barrier block 60.

The plurality of pixel units 50 is disposed on the TFT substrate 10. A predetermined interval is disposed between adjacent two of the pixel units 50. That is to say, an inter-pixel area D is disposed between adjacent two of the pixel units 50.

Each of the pixel units 50 comprises an electrode layer 20, and a pixel defining layer 30 disposed on the electrode layer 20. A pixel opening 31 is defined by the pixel defining layer 30 above the electrode layer 20. The barrier block 60 is disposed on adjacent two of the pixel defining layers 30 of adjacent two of the pixel units 50.

The TFT substrate 10 includes a substrate 11, a TFT array layer 12, and a planar layer 13. The planar layer 13 is disposed between the electrode layer 20 (the anode layer) and the TFT array layer 12.

The substrate 10 may be a flexible substrate such as a polyimide film. The substrate 10 may also be a rigid substrate such as a quartz substrate or a glass substrate.

Specifically, a material of the electrode layer 20 is a multi-layer structure composed of indium tin oxide or indium tin oxide-silver-indium tin oxide (ITO/Ag/ITO).

The pixel defining layer 30 is disposed around the periphery of the pixel unit 50. The pixel defining layer 30 exposes the light emitting area A to form the pixel opening 31, such that the pixel defining layer 30 is disposed around the pixel opening 31, and the barrier block 60 is disposed around the pixel opening 31.

In more detail, the barrier block 60 is formed across the adjacent two of the pixel defining layers 30 of the adjacent two of the pixel units 50 by using the second mask. In more detail, the barrier block 60 is disposed on both of the adjacent two of the pixel defining layers 30 of the adjacent two of the pixel units 50, and may be a trapezoidal structure, but is not limited thereto. A width W1 of the barrier block 60 is less than a sum of the two respective widths W2 of the adjacent two of the pixel defining layers 30 of the adjacent two of the pixel units 50 and a width W3 of the inter-pixel area D. That is, the barrier block 60 only partially covers the adjacent two of the pixel defining layers 30 of the adjacent two of the pixel units 50, respectively. Moreover, the barrier block 60 extends from the pixel defining layer 30 to a place between the adjacent two of the electrode layers 20 between the adjacent two of the pixel units 50 to prevent the overflowed ink from flowing to the place between the adjacent two of the electrode layers 20. Besides, the barrier block 60 is made of a hydrophobic material, and the pixel defining layer 30 is made of a photosensitive material.

Figure 6A:
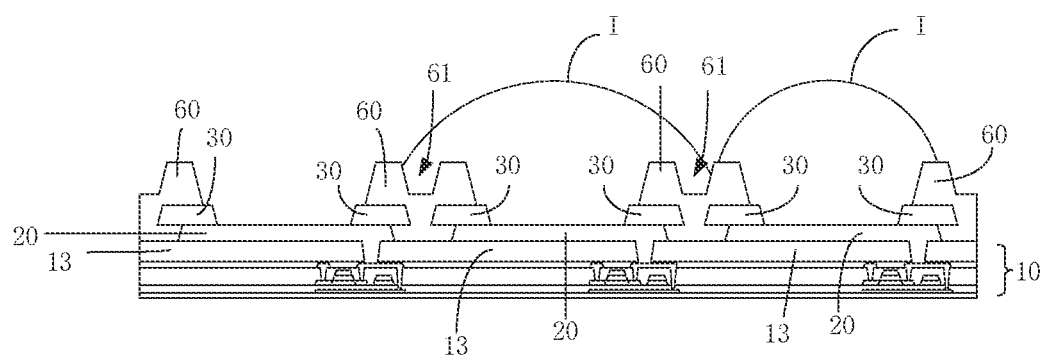
FIG. 6A is a schematic diagram of the OLED back plate printed with ink according to the disclosure.

In addition, a top surface of the barrier block 60 comprises a recess 61. According to an embodiment of the present disclosure, a projection area of the inter-pixel area D is smaller than a projection area of an area between the electrode layers 20 of adjacent two of the pixel units 50. That is, the electrode layer is over-etched to facilitate the fabrication of the recess 61. The recess 61 can accommodate excess ink droplets, and the excess ink droplets can flow into the recess 61, rather than flowing into the adjacent pixel unit 50, as shown in FIG. 6A. The recess accommodates excess droplets for achieving the effect of preventing different colors of ink droplets belonging to different pixel units from mixing with each other.

Figure 6B:
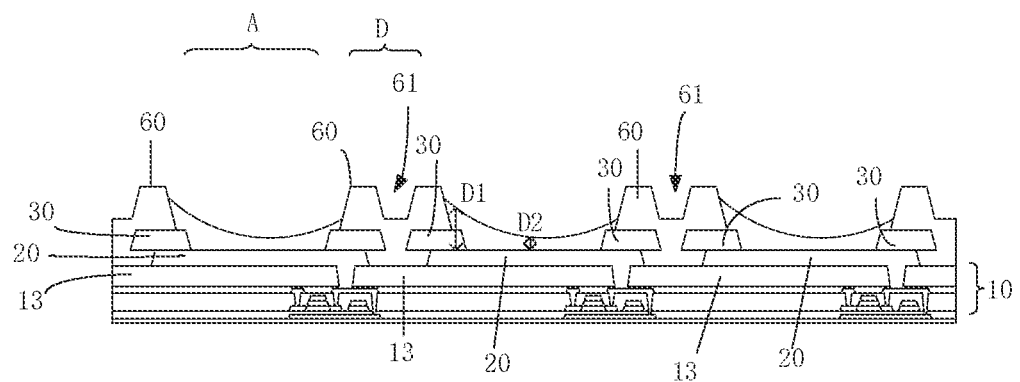
FIG. 6B is a schematic diagram of the OLED back plate after curing the printed ink according to the disclosure.

The pixel defining layer 30 is disposed between the electrode layer 20 and the barrier block 60. As shown in FIG. 6B, a thickness D1 of the ink droplets I close to a lateral side of the barrier block 60 is relatively larger than a thickness D2 of the ink droplets I away from the lateral side (i.e., in the middle of the light emitting area) of the barrier block 60. A region where the thickness of the ink droplet is relatively larger is covered by the pixel defining layer 30, so that light is not emitted from the region, and light only emitted from a region (the light emitting area A) comprising a consistent thickness of the ink droplets, and an uniform light emitting effect can be obtained.

The technical effects are as follows. The disclosure provides a method of manufacturing an OLED back plate and the OLED back plate. The pixel defining layer is formed on the anode layer by the first mask, the barrier block is formed on the pixel defining layer by the second mask, and the barrier block does not completely cover the pixel defining layer. Under the premise that the number and use times of the mask are not increased, a portion of the pixel unit corresponding to an ink droplet having a large thickness close to a side of the barrier block is covered by the pixel defining layer, so that light cannot be emitted from the portion, and a portion of the pixel unit corresponding to an ink droplet having a small thickness away from a side of the barrier block is not covered by the pixel defining layer, so that light is emitted from the portion. The thickness of the ink droplets away from the lateral side of the barrier block (i.e., the pixel opening, the light emitting area of the pixel unit) is uniform, and the uniformity of the ink droplets in the light emitting area of the pixel unit is improved. In addition, the recess of the barrier block can accommodate excess ink droplets. The excess ink droplets flow into the recess without flowing into the adjacent pixel units. Therefore, the amount of ink droplets in each pixel unit can be controlled, and the ink droplets between the two pixel units can be prevented from being mixed, so that the subsequent products can achieve an ideal display effect.

This disclosure has been described with preferred embodiments thereof, and it is understood that many changes and modifications to the described embodiment can be carried out without departing from the scope and the spirit of the invention.

What is claimed is:

1. A method of manufacturing an OLED back plate, comprising steps of:
   providing a TFT substrate, and forming an electrode layer on the TFT substrate;
   forming a pixel defining layer on the electrode layer, and dividing the pixel defining layer to form a plurality of pixel units, wherein each of the pixel units comprises a portion of the pixel defining layer and a light emitting area, and an inter-pixel area is formed between adjacent two of the pixel units;
   etching the electrode layer corresponding to the inter-pixel area wherein the electrode layer is divided into a plurality of portions, and each portion corresponds to the portion of the pixel defining layer, each of the pixel units comprises a portion of the electrode layer, and the pixel defining layer of each pixel unit is correspondingly disposed on each portion of the electrode layer;
   removing the pixel defining layer of each of the pixel units corresponding to the light emitting area to form a pixel opening; and
   forming a barrier block between adjacent two of the pixel defining layers of adjacent two of the pixel units.

2. The method of manufacturing the OLED back plate according to claim 1, wherein a recess is formed on a top surface of the barrier block.

3. The method of manufacturing the MED back plate according to claim 1, wherein the barrier block is made of a hydrophobic material.

4. The method of manufacturing the OLED back plate according to claim 1, wherein the pixel defining layer is made of a photosensitive material.

5. The method of manufacturing the OLED back plate according to claim 1, wherein the barrier block extends from the pixel defining layer to adjacent two portions of the electrode layer between the adjacent two of the pixel units.

6. The method of manufacturing the OLED back plate according to claim 1, wherein a projection area of the inter-pixel area is smaller than a projection area of an area between the portions of the electrode layer of adjacent two of the pixel units.

7. The method of manufacturing the OLED back plate according to claim 1, wherein the pixel defining layer is disposed around the pixel opening, and the barrier block is disposed around the pixel opening.

8. An OLED back plate, comprising:
a TFT substrate;
a plurality of pixel units disposed on the TFT substrate, wherein an inter-pixel area is disposed between adjacent two of the pixel units; and wherein each of the pixel units comprises:
an electrode layer; and
a pixel defining layer disposed on the electrode layer, wherein a pixel opening is disposed on the pixel defining layer above the electrode layer; and
wherein the OLED back plate comprises:
a barrier block disposed on adjacent two of the pixel defining layers of adjacent two of the pixels units, wherein the barrier block extends from the adjacent two pixel defining layers to the adjacent two of the electrode layers between the adjacent two of the pixels units, and the barrier block is disposed between the two adjacent electrode layers, the two adjacent pixel defining layers, and on top of the two adjacent pixel defining layers.

9. The OLED back plate according to claim 8, wherein a recess is disposed on a top surface of the barrier block.

10. The OLED back plate according to claim 8, wherein the barrier block is made of a hydrophobic material.

11. The OLED back plate according to claim 8, wherein the pixel defining layer is made of a photosensitive material.

12. The OLED back plate according to claim 8, wherein a projection area of the inter-pixel area is smaller than a projection area of an area between the electrode layers of adjacent two of the pixel units.

13. The OLED back plate according to claim 8, wherein in each pixel unit, the pixel defining layer is disposed around the pixel opening, and the barrier block is disposed around the pixel opening.

* * * * *